Figure 1:
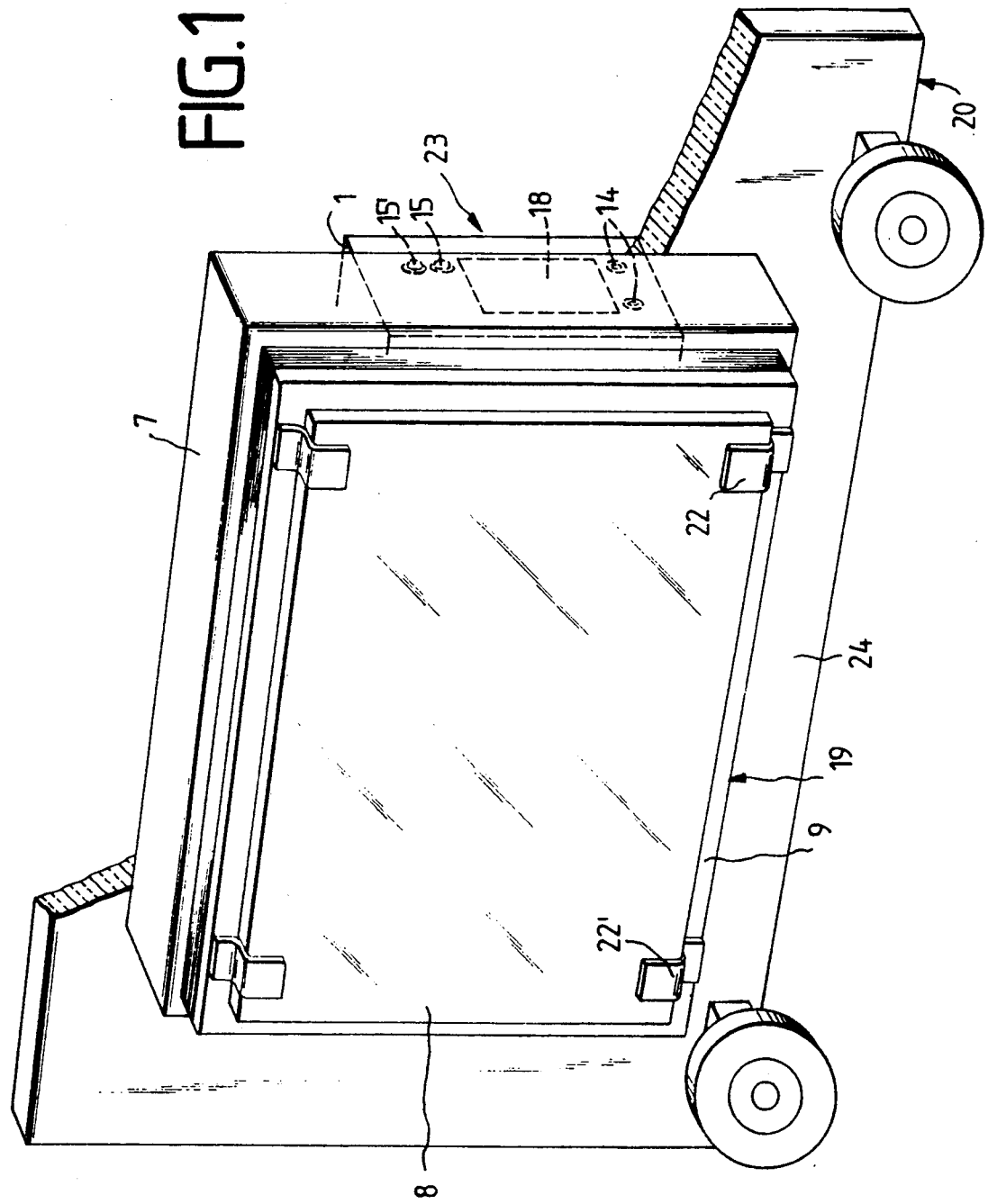

United States Patent [19]

Jung

[11] Patent Number: 5,122,636
[45] Date of Patent: Jun. 16, 1992

[54] MOVABLE DEVICE FOR HEATING SUBSTRATES

[75] Inventor: Michael Jung, Kahl, Fed. Rep. of Germany

[73] Assignee: Leybold Aktiengesellschaft, Hanau, Fed. Rep. of Germany

[21] Appl. No.: 460,357

[22] Filed: Jan. 3, 1990

[30] Foreign Application Priority Data

Nov. 17, 1989 [DE] Fed. Rep. of Germany ....... 3938267

[51] Int. Cl.$^5$ .................................................. B23K 9/00
[52] U.S. Cl. .................................. 219/121.43; 219/209; 219/121.4; 204/298.15; 204/298.23; 204/298.09
[58] Field of Search ............ 219/121.4, 121.41, 121.43, 219/10.57, 121.52, 209; 204/298.15, 298.23, 298.27, 298.24, 298.09; 156/345, 646; 427/34

[56] References Cited

U.S. PATENT DOCUMENTS

| | | | |
|---|---|---|---|
| 3,622,753 | 11/1971 | Lax et al. ............................. | 219/268 |
| 3,705,285 | 12/1972 | Cachat ............................... | 219/10.57 |
| 4,194,962 | 3/1980 | Chambers et al. .............. | 204/298.23 |
| 4,261,808 | 4/1981 | Walter ............................... | 204/298.25 |
| 4,273,989 | 6/1981 | Hinton et al. ........................ | 219/268 |
| 4,282,924 | 8/1981 | Faretra ............................. | 204/288.15 |
| 4,430,547 | 2/1984 | Yoncola et al. ................. | 219/121.43 |
| 4,650,064 | 3/1987 | Slabaugh ........................ | 204/298.15 |
| 4,828,668 | 5/1989 | Yamazaki et al. ............. | 204/298.23 |

FOREIGN PATENT DOCUMENTS

| | | |
|---|---|---|
| 2358002 | 5/1975 | Fed. Rep. of Germany . |
| 8426772.0 | 11/1984 | Fed. Rep. of Germany . |
| 3814924 | 11/1989 | Fed. Rep. of Germany . |

*Primary Examiner*—Mark H. Paschall
*Attorney, Agent, or Firm*—Felfe & Lynch

[57] ABSTRACT

A device for heating up a substrate to be coated in a vacuum coating system, for example a plasma sputtering system, has a heating device 23 disposed on a substrate carriage 20 which can be moved across the process chamber transversely to the coating source. This heating device has an independent voltage generator, for example a rechargeable accumulator, disposed in a special chamber of the heating device. The chamber for the accumulators can be hermetically sealed by way of a cover such that this chamber is under atmospheric pressure even when the substrate carraige 20, together with the heating device 23, enters the process chamber of the system which contains the vacuum. The accumulators are recharged via plug couplings 14,14' after the heating device has heated up the substrate 8 which is clamped thereto and the device has exited the process chamber via a sluiceway.

8 Claims, 2 Drawing Sheets

MOVABLE DEVICE FOR HEATING SUBSTRATES

The invention relates to a device for heating substrates to be coated in a vacuum coating system. This coating system includes a process chamber, a coating source deposited therein, for example a plasma sputtering source, and a substrate carriage which can be moved across the process chamber transversely to the coating source and is supported or guided in rails and-/or between gliding or rolling bodies.

Devices for heating up a substrate in order to apply a special coating have already been suggested in which sliding contacts and/or trailing cables connect the heater to a power source outside the process chamber. These devices have the disadvantage that an unavoidable particle abrasion contaminates the process chamber thus causing irregular coatings. Moreover, the process chamber must be provided with passageways for the power supply which is disadvantageous for the operational safety of the system.

It is an object of the present invention to provide a device of the aforesaid kind which does not produce particle abrasion and is also suited for those systems already in operation, i.e. it can supplement present systems, is inexpensive to manufacture and permits maintaining a certain substrate temperature in narrow limits.

The object is accomplished in accordance with the invention in that the substrate carriage has a heating device with a substrate holder and the heating device is provided with its own voltage generator disposed in a special chamber of this heating device, a power control device, an operating element and an electric heating element, for example a plate-like, electric resistance heater.

Preferably, the voltage generator is a galvanic element, for example a rechargeable accumulator having a power control device, which is provided with terminals, preferably plug couplings, for recharging the voltage generator.

Advantageously, at least the voltage generator is disposed in a chamber of a first casing. This chamber can be hermetically sealed by means of a cover such that the voltage generator is under atmospheric pressure during the coating process whereas the operating element is disposed in an additional chamber of the device casing which can also be sealed with a cover such that during the coating process, the second chamber is exposed to the pressure prevailing in the process chamber.

Advantageously, the voltage generator, the operating element and the control device are disposed in a common casing which has several chambers. The casing itself is connected, preferably screwed, to the substrate carriage.

For a favorable mounting, the substrate carriage consists of one wall piece which essentially extends in a vertical plane. This wall piece has a window-like opening in which the casing for the accumulator, the operating element and the power control device are inserted. The heating element which is mounted to the second casing part extends in a plane parallel to the one of the wall of the substrate carriage.

Further, the casing has at least one vacuum-tight current passageway connecting the voltage generator, for example a galvanic secondary element or secondary battery, to a power control element and/or operating element, the terminal for recharging and the heating element, for example an electric resistance heating.

The invention permits the most variable embodiments one of which is diagrammatically represented in further detail in the attached drawing. Referring now to the Figs.

Figure 2:
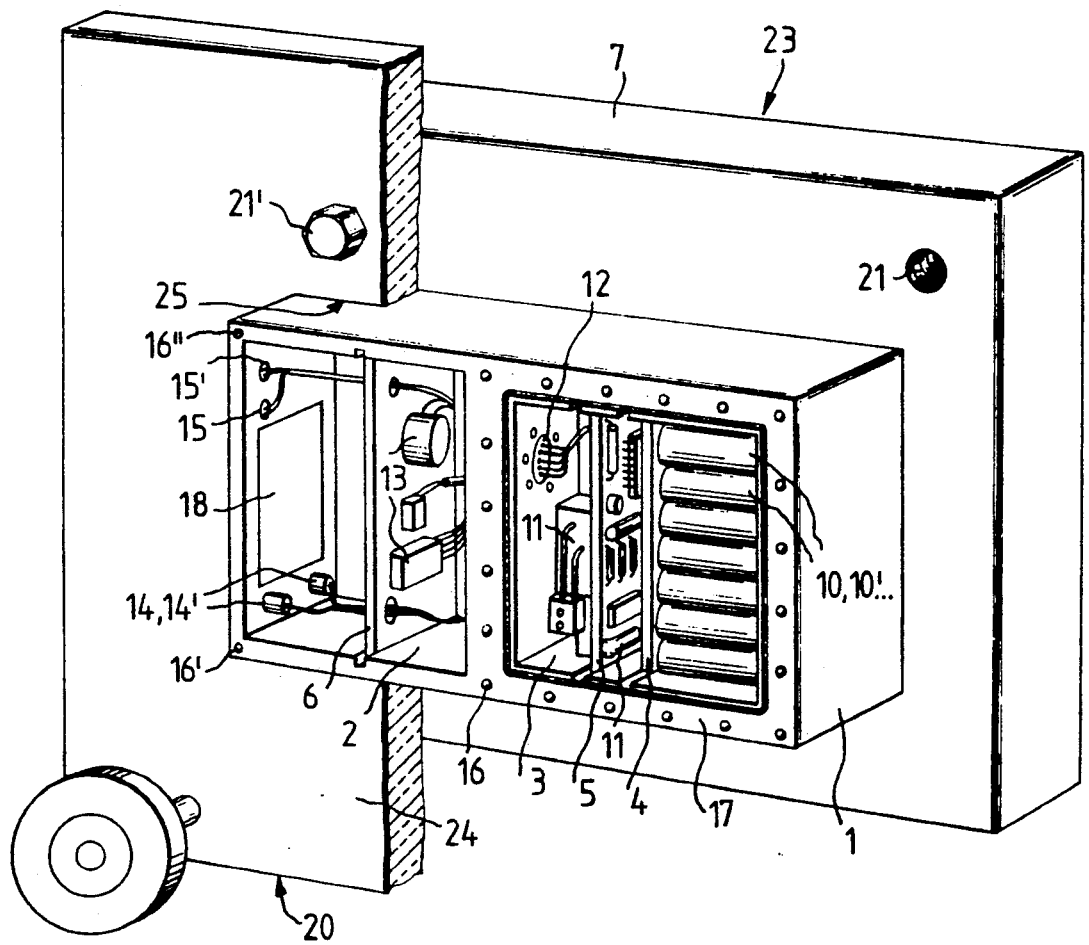

FIG. 1 is perspective and partially sectional view of a substrate carriage which can be moved on rolls and, mounted to this carriage, a device for heating up substrates and FIG. 2 is a perspective illustration of the device of FIG. 1, the rear wall, however, is removed.

The device includes a parallelpiped first casing 1 which is divided in two chambers 2, 3 which in turn are partitioned by plate-like elements 4, 5, 6. The first casing 1 is as one piece connected to a slightly larger second casing 7. At the side facing toward the substrate 8, the latter is provided with a heating element 9. The chamber 3 contains a multiple of rechargeable batteries 10, 10', 10''', . . . which are connected to an electronic control unit or a power control unit 11 which in turn is connected via a pressure-proof cable passageway 12 to an operating element 13 and to plug couplings 14, 14'.

A cover which is not represented in further detail serves to seal the casing 1 via a series of screwed connections the threaded boreholes 16, 16' of which are clearly visible in FIG. 2. The cover and the front surface 17 are manufactured so precisely that the chamber 3 is pressure-tight sealed after the cover is screwed thereon. This connection is carried out such that after the casing 1 is subsequently incorporated in the process chamber of the system, the atmospheric pressure present in the chamber 3 is completely maintained after the closing of the latter even when the process chamber is evacuated, i.e. a vacuum condition prevails in this chamber.

Since the cable passageway 12 is also pressure-proof configured, particles or gases from the chamber 3 cannot intrude into the process chamber and interfere with the coating process while the latter is carried out, i.e. while the device is in the process chamber.

There is also a power connection which is not represented in further detail from the electronic control unit or power control 11 to the chamber 2 and from the latter to the heating element 9 which is in the second casing 7 or at least at the front side thereof. On its smaller side, the first casing 1 can be closed with a flap 18 which permits access to the operating element 13.

The device of FIG. 2 is inserted into a rectangular, window-like opening 15 of the vertical wall 24 of the substrate carriage 20. This opening 25 is dimensioned such that it can just be passed through the first casing 1. The second casing 7 has threaded boreholes 21, 21', which serve to screw the second casing 7 to the wall 24 of the substrate 20. The front side of the casing 7 is mainly formed by the heating element 9 on which the substrate rests that is held, for this purpose, by supporting fingers or claws 22, 22', . . . .

Together with the substrate carriage 20, the described device for heating substrates 8 enters the process chamber (not represented) after the desired temperature for the substrate 8 was selected at the device 23 via the operating element 13. Interacting with the power control unit 11, the initially fully charged batteries 10, 10', . . . permit a controlled heating up of the substrate 8 for at least the time until the coating procedure is completed and the substrate carriage has left the process chamber through a corresponding sluiceway.

After removing the completely coated substrate 8 from the heating element 9, the batteries 10, 10', . . . can be recharged outside the process chamber via plug couplings 14, 15. The device is then ready for the next coating procedure. Control lamps 15, 15', . . . permit a constant monitoring of the operational conditions and indicate whether the device 23 is ready for operation.

In order to permit a quick replacement of the accumulator, a further embodiment permits the latter to be disposed in a third removable casing (not represented in further detail). It is understood that the necessary cable connections to the power control unit and heating element must be provided.

Listing of Parts 1 casing, first casing
2 chamber
3 chamber
4 plate-like component
5 plate-like component
6 plate-like component
7 casing, second casing
8 substrate
9 heating element
10, 10'. . . rechargeable battery
11 power control unit
12 pressure-proof cable passageway
13 operating element
14 plug connection
15, 15' control lamps
16, 16' . . . threaded borehole
17 front side of the casing 1
18 flap
19 substrate holder
20 substrate carriage
21, 21' threaded borehole and nut
22, 22' . . . claw
23 heating device
24 wall
25 window-like opening

I claim:

1. Device for heating a substrate to be coated in a vacuum coating system comprising: p1 a substrate carriage which is movable across a process chamber, transversely to a coating source, and has a separate chamber for maintaining atmospheric pressure therein, the substrate carriage including
    a heating device having a substrate holder, the heating device having its own voltage generator disposed in the separate chamber,
    a power control device interactive with the voltage generator,
    an operating element for controlling the heating device for selecting the desired temperature for the substrate, and
    an electric heating element connected to the power control device.

2. Device in accordance with claim 1, in which the voltage generator is a rechargeable battery and the control device has terminals for recharging the voltage generator.

3. Device in accordance with claim 1, which includes a first casing having the chamber and in which at least the voltage generator is disposed in the chamber of the first casing, which includes a cover for hermetically sealing this chamber such that the voltage generator is subject to atmospheric pressure even during a coating procedure.

4. Device in accordance with claim 1, which includes a first casing and in which the first casing has a second chamber and in which the operating element is disposed in the second chamber and which includes a cover for sealing the second chamber such that this second chamber is exposed to the pressure prevailing in the process chamber.

5. Device in accordance with claim 1, which includes a common casing which has several chambers and in which the casing itself is connected to the substrate carriage and in which the voltage generator, the operating element and the control device are contained in the common casing.

6. Device in accordance with claim 3, which includes a wall which extends in a vertical plane and has a window-like opening into which the first casing for the voltage generator, the operating element and the power control device is inserted and in which the substrate carriage is essentially formed by the wall, whereby a second casing which firmly rests against the wall has the heating element extending in a plane parallel to the wall of the substrate carriage.

7. Device in accordance with claim 6, which includes terminals for recharging the voltage generator, in which the first casing has at least one vacuum-tight current passageway 12 connecting the voltage generator, on the one hand, to the power control unit and, on the other hand, to the operating element and the terminals for recharging the voltage generator.

8. Device in accordance with claim 3, which includes a separate third casing which is hermetically sealed with a cover and in which the voltage generator is disposed in a chamber which is enclosed by the third casing, and which includes a pressure-proof cable passageway in a wall of the third casing and this wall serves to make an electric connection between the voltage generator, on the one hand, and, on the other hand, the power control device.

* * * * *